United States Patent [19]

Kim et al.

[11] Patent Number: 5,397,719
[45] Date of Patent: Mar. 14, 1995

[54] METHOD FOR MANUFACTURING A DISPLAY PANEL

[75] Inventors: Sang-Soo Kim, Seoul; In-Sik Jang, Songtan; Dong-Kyu Kim; Yong-Kuk Bae, both of Suwon, all of Rep. of Korea

[73] Assignee: Samsung Electronics Co., Ltd., Suwon, Rep. of Korea

[21] Appl. No.: 94,986

[22] Filed: Jul. 22, 1993

[30] Foreign Application Priority Data

Jul. 22, 1992 [KR] Rep. of Korea ............... 1992-13025

[51] Int. Cl.$^6$ ........................................ H01L 21/265
[52] U.S. Cl. ........................................ 437/40; 437/51; 437/235; 437/983; 148/DIG. 118
[58] Field of Search ................. 437/40, 181, 983, 47, 437/48, 51, 914; 148/DIG. 118, DIG. 117, DIG. 116, DIG. 14

[56] References Cited

U.S. PATENT DOCUMENTS

| | | | |
|---|---|---|---|
| 4,871,234 | 10/1989 | Suzuki | 437/181 |
| 4,997,788 | 3/1991 | Martens et al. | 437/181 |
| 5,070,379 | 12/1991 | Nomoto et al. | 437/189 |
| 5,086,009 | 2/1992 | Sangouard | 437/48 |

FOREIGN PATENT DOCUMENTS 60193367 10/1985 Japan ........................ 437/195

Primary Examiner—Brian E. Hearn
Assistant Examiner—Michael Trinh
Attorney, Agent, or Firm—Charles R. Donohoe; Robert Westerlund, Jr.; Stephen R. Whitt

[57] ABSTRACT

The present invention relates to an improved method of manufacturing pads of a display panel. Al or Al alloy is deposited and patterned on a glass substrate for forming a plurality of gate electrodes and lines. Then a plurality of pads are formed with Ta or Ti, which is capable of forming an anodic oxide thereof; each pad extending over an edge of each of the respective gate lines to provide an electrical coupling therebetween. Thereafter, the entire surface of the pads, gate electrodes and lines is subjected to an anodic oxidation under a high anodization voltage. Anodic oxide layers on the pads are then etched away together with a silicon nitride layer during a subsequent pad opening processing step. Consequently, in accordance with the invention, a photoresist masking process for the selective anodic oxidation of Al gate lines and electrodes is eliminated.

6 Claims, 4 Drawing Sheets

METHOD FOR MANUFACTURING A DISPLAY PANEL

FIELD OF THE INVENTION

This invention relates to a method for manufacturing a display panel; and, in particular, to an improved method for manufacturing an amorphous silicon thin film transistor(a-Si TFT) liquid crystal display(LCD) panel wherein the anodic oxidation of gate electrodes and lines is carried out without using a protection layer for selective anodic oxidation.

Description of the Prior Art

At present, the so-called a-Si TFT process is the dominant technology for manufacturing LCD panels because it can realize high quality image displays of a substantial size, using a low temperature(e.g., below 350° C.) process. The TFT architecture uses an array of horizontal gate and vertical data lines fabricated on a transparent glass substrate. The a-Si TFT technology also requires the use of a separate peripheral integrated circuitry to drive the gates and sources of the TFTs in the matrix. Normally, therefore, there is provided a plurality of pads for connecting the gate and data lines to the respective drive circuitry. A tape automated bonding(TAB) is generally used for electrically coupling the plurality of pads with their corresponding drive circuitry.

FIG. 1 shows a schematic plan view of a typical TFT having a conventional display panel array. The architecture comprises an array of horizontal gate lines 13 and vertical data lines 19 linking gate electrodes 12 and source electrodes (not shown), respectively, on one sheet of glass substrate 10 wherein a transistor 15 is located at each intersection of the gate and the data lines 13 and 19. A drain electrode 16 of each TFT is connected to a pixel electrode 17 for forming a capacitor via a liquid crystal cell. A plurality of pads (not shown) is provided at the peripheral edges of the glass substrate 10 for coupling the gate and the data lines 13 and 19 with their respective drive circuitry.

In a reverse staggered type TFT which is widely used for forming an a-Si TFT LCD display panel, typically, the manufacturing process begins with the formation of a metal layer for the gate electrodes and lines. Since, in large displays, even a signal delay in the gate line can be critical in realizing a high display uniformity, the time constant derived from the line resistivity and capacitance should be minimized. Another critical aspect thereof lies in the anodic oxidation of the gate metal.

Because of these criticalities, Al gate has become a best known choice. For Al is of a low resistivity and also capable of forming $Al_2O_3$ through the anodic oxidation thereof. These features contribute greatly to reducing the defects in the panel and are indispensable for manufacturing large size displays.

However, Al, which may be used for the gate electrodes and lines as described hereinabove, is not a suitable pad metal or TAB connection. Therefore, a hard metal such as Ta or Cr is used for such purpose. The interconnection between the pads and the gate lines is achieved by protecting a pad and gate line contact region on the gate line from the anodic oxidation thereof.

In FIGS. 2A to 2D, one of the conventional pad formation processing sequences is illustrated. First, Al gate electrodes and lines 22 are deposited and patterned by photolithography on a glass substrate 20 (FIG. 2A). Then a photoresist layer 24 is applied and defined for protecting a pad-gate line contact region (FIG. 2B), followed by the anodic oxidation thereof; and an Al anodic oxide layer 26 is formed, as shown in FIG. 2C, on the surface of the Al gate line 22 which is not covered by the photoresist mask layer 24. The photoresist mask layer 24 is then stripped and the pad formation is finalized by depositing and defining a pad metal 28 such as Ta or Cr on the pad-gate line contact region (FIG. 2D).

Another prior art pad formation process is shown in FIGS. 3A to 3D. In this process, pads 38 are formed first on a glass substrate 30, followed by a gate metallization including gate electrodes and lines 32 (FIG. 3A). Next, as shown in FIG. 3B, a photoresist layer 34 is applied and masked for protecting the pad region from the anodic oxidation. As is shown in FIG. 3C, the surface of the Al gate line 32, which is not masked, is anodized to form an $Al_2O_3$ layer 36 during the anodic oxidation process. The last processing step ends with the stripping of the photoresist mask layer 34 off the pad region (FIG. 3D).

In these prior art pad formation processes, as illustrated in FIGS. 2 and 3, the anodic oxidation of the gate electrodes and lines is carried out selectively by protecting either the pad-gate line contact region as shown in FIG. 2 or the pad region as shown in FIG. 3 during the anodic oxidation process. Such processes, therefore, inevitably require a protection layer formation step. Among several materials, e.g., photoresist, silicon nitride or silicon oxide, which could be used for providing such a protective layer, photoresist is generally used as the protection layer despite the deficiencies that it fails to confer good adhesivity to the Al layer and can hardly withstand a high anodization voltage. For use of other protection layers than the photoresist normally requires extra processing steps.

Consequently, when the photoresist is used as the protection layer as illustrated in FIGS. 2 and 3, the anodization voltage is limited, which in turn affects the formation of the Al anodic oxide film. Specifically, such limitation entails the formation of hillocks and whiskers during subsequent heat processes and produces defects due to shorts between the gate and the data lines, despite the well known fact that Al anodic oxide film is very stable and serves as a protective layer against hillock formation.

Accordingly, there has existed a long-felt need to develop a new technique capable of providing a thicker Al anodic oxide layer to reduce the shorts between the lines. One of such methods is disclosed in Japanese Patent Laid-open Publication No. 90-85826. To obtain a thick $Al_2O_3$ film, anodization voltages higher than 140 V, for example, are taught to be applied. However, application of such high voltages often causes lifting and cracking of the photoresist protection layer. Another problem that resides in such additional photolithography process is a possible surface residual contamination, which tends to deteriorate the production yield.

SUMMARY OF THE INVENTION

It is, therefore, an object of the invention to provide a display panel manufacturing method which requires no photoresist masking step for the fabrication of pads and interconnection contacts between the pads and the gate lines and which provides an improved anodic oxide layer on the gate lines and electrodes and thereby substantially reduces or eliminates the defects that normally exist in the prior art manufacturing process, due to the shorts occurring between the gate and the data lines.

Another object of the invention is to provide a display panel manufacturing method which simplifies the processing steps to thereby achieve a higher production yield and reliability.

In accordance with the present invention, there is provided a method for manufacturing a display panel comprising the steps of: (a) forming a plurality of gate electrodes and lines on a glass substrate; (b) creating a plurality of pads on the glass substrate, each of said pads extending to cover an edge of each of said respective gate lines so as to provide an electrical coupling therebetween; (c) performing an anodic oxidation on said gate electrodes, gate lines and pads to thereby form an anodic oxide layer on the entire surface thereof; (d) depositing an insulation layer on the glass substrate treated in accordance with steps (a) to (c) above; (e) producing thin film transistors on the insulation layer; (f) constructing a photoresist pattern on the glass substrate treated in accordance with steps (a) to (e) above; (g) etching the insulation layer and the anodic oxide layer on said pads by using the photoresist pattern as a mask so as to expose said pads; and (h) stripping off the photoresist pattern.

In accordance with one aspect of the invention, the gate electrodes and lines are formed concurrently with Al or Al alloys such as Al—Si, Al—Pd, Al—Ni, Al—Ge and Ai—W which are of a low resistivity and also capable of forming $Al_2O_3$ by the anodic oxidation. The pads are provided with such a hard metal as Ta or Ti, which can be anodized and is amenable for a TAB connection.

In accordance with another aspect of the invention, the anodic oxidation of the pads and gate electrodes/lines is carried out, without using a photolithography process for the masking thereof, after the gate and pad metallization has been conducted. The anodic oxide layer formed on the surface of the pads is removed, together with a silicon nitride layer formed by a subsequent process, during the last processing step for opening the pad regions for a TAB connection. Consequently, no additional photolithography process for masking a metal layer against the anodic oxidation thereof becomes necessary; and a higher anodization voltage can be applied to form a thicker oxide layer without creating the photoresist lifting and cracking problems that have hampered the conventional manufacturing process.

BRIEF DESCRIPTION OF THE DRAWINGS

The present invention together with its objects and advantages will become more apparent in a detailed description of the preferred embodiments presented below with reference to the accompanying drawings wherein.

DETAILED DESCRIPTION OF THE PREFERRED EMBODIMENTS

Referring now to FIG. 4, there is provided a process for performing the anodic oxidation of gate electrodes and lines without having to employ a protection layer in accordance with a preferred embodiment of the present invention.

Figure 1:
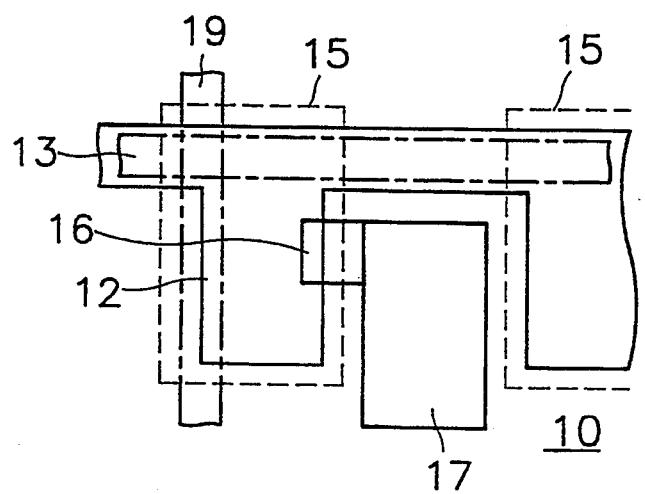
FIG. 1 shows a schematic plan view of a conventional TFT array matrix.
Figure 2A:
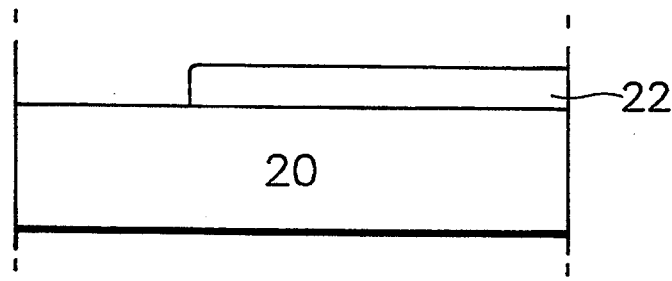
FIGS. 2A to 2D depict a schematic cross-sectional view illustrating one of the prior art processing sequences for pad formation.
Figure 2B:
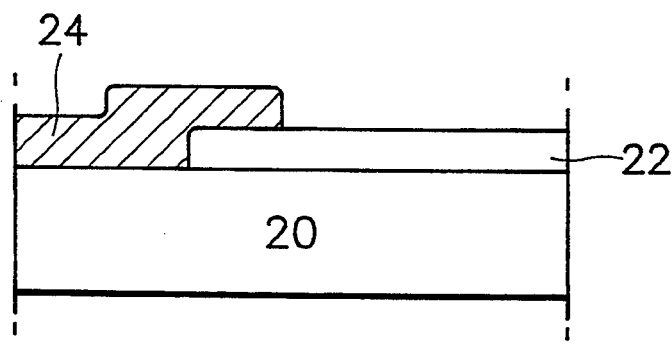
Figure 2C:
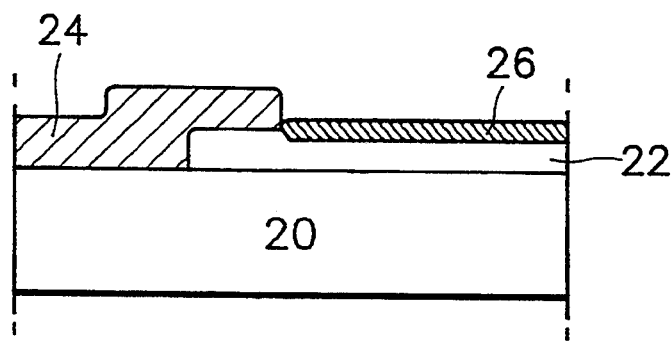
Figure 2D:
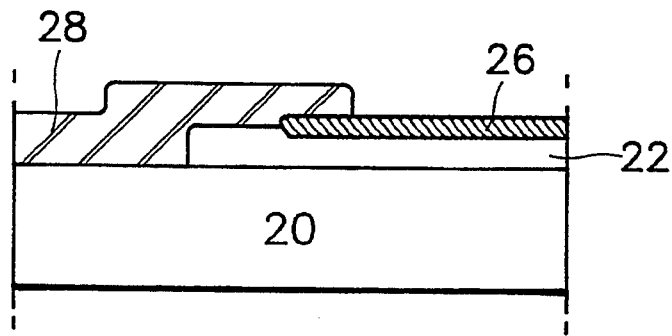
Figure 3A:
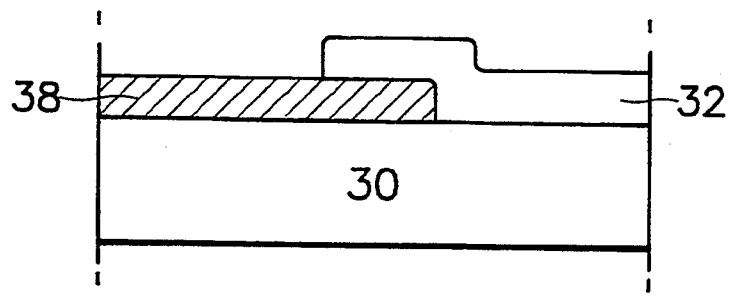
FIGS. 3A to 3D represent a schematic cross-sectional view illustrating another prior art processing sequence for pad formation.
Figure 3B:
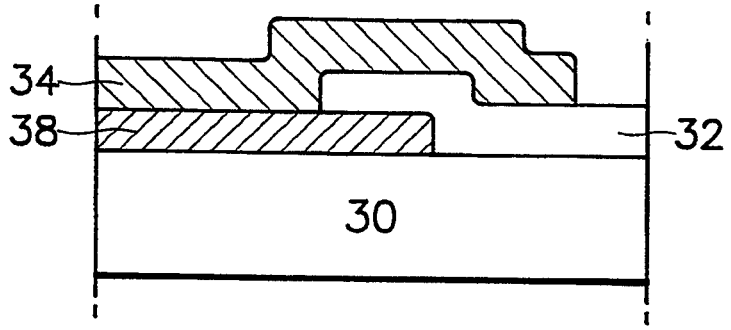
Figure 3C:
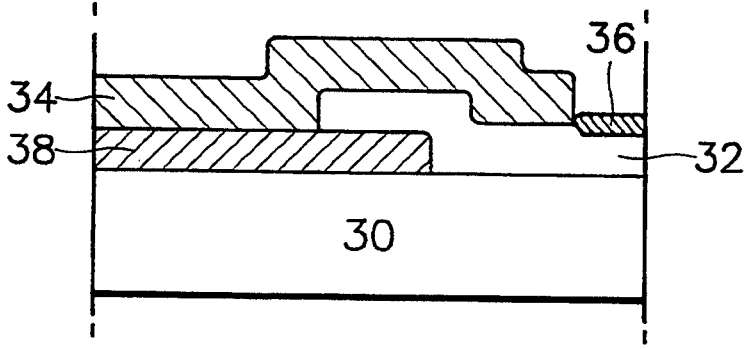
Figure 3D:
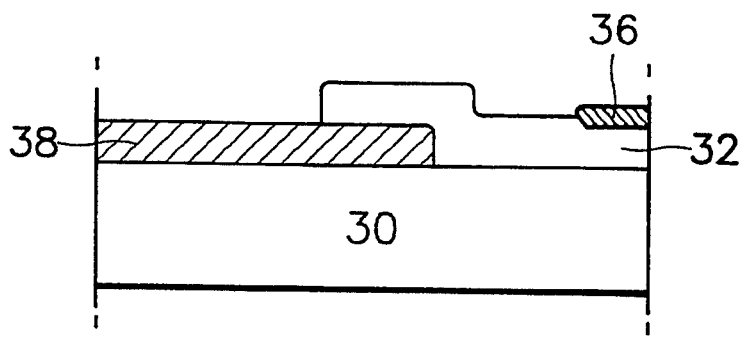
Figure 4A:
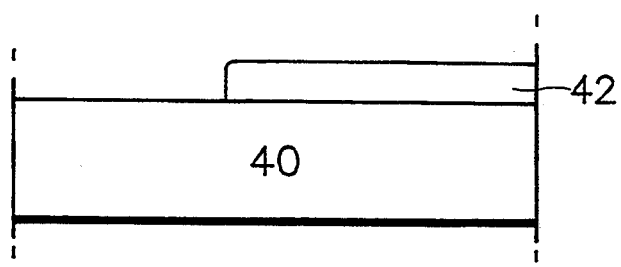
FIGS. 4A to 4E provide a schematic cross-sectional view illustrating the processing sequence in accordance with a preferred embodiment of the present invention.

As shown in FIG. 4A, an Al layer is deposited by sputtering on a glass substrate 40 and is patterned to form gate electrodes(not shown) and gate lines 42. Other metal or alloy, which can be anodized, than Al such as Al alloy(Al—Si, Al—Pd, Al—Ni, Al—Ge or Al—W), Mo, Ti, Ta, Mo—Ta or the like, or any combination thereof may also be used in lieu of Al.

Figure 4B:
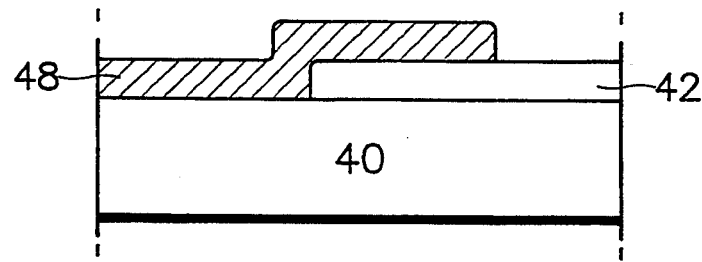
Figure 4C:
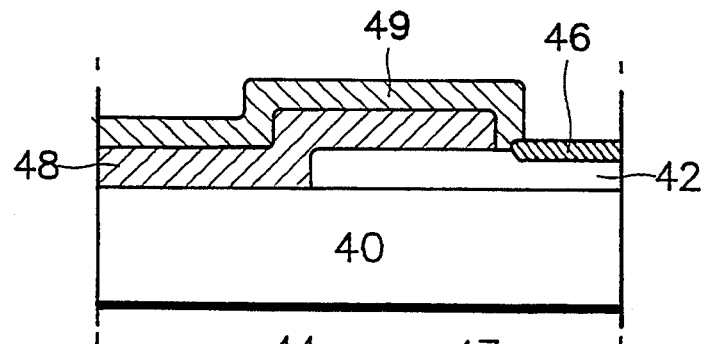

In the next step as shown in FIG. 4B, a Ta pad layer, which is compatible with TAB connection and also capable of forming an anodic oxide, is deposited and patterned for forming a pad 48 extending over the edge of the gate line 42. Mo, Ti, Mo—Ta or the like, which can be anodized, or any combination of these and Ta may also be used instead of Ta.

Thereafter, anodic oxidation is carried out to form anodic oxide layers 46 and 49 on the surface of the gate line 42 and pad 48 (see FIG. 4C), respectively. After the anodic oxidation process, it is preferable that the anodic oxide layer 46 and gate line 42 attain a thickness of about 2000 Å, respectively; while the thickness of the anodic oxide layer 49 and pad 48 may be about 2200 Å and 3200 Å, respectively.

The above anodic oxidation is carried out in a solution of pH 7.0±0.5 comprising 3% tartaric acid, $NH_4OH$ as an additive, and ethyleneglycol as a diluent. The gate lines and electrodes serve as an anode; and stainless steel or Pt is used as a cathode.

The anodization voltage and current are controlled to provide high quality anodic oxide films. The preferred anodization voltage is about 140 V and the preferred current density lies within the range of 0.5–5 $mA/cm^2$. In accordance with the present invention, no photoresist pattern for selective anodic oxidation is employed, thereby rendering it possible to apply high voltages during the anodic oxidation process so as to produce thick anodic oxide layers 46 and 49.

After the formation of the anodic oxide layers 46 and 49, a silicon nitride layer 47 is deposited, followed by a TFT array structure fabricated in a conventional manner (which is not germane to the present invention and, therefore, not depicted for the sake of simplicity).

Figure 4D:
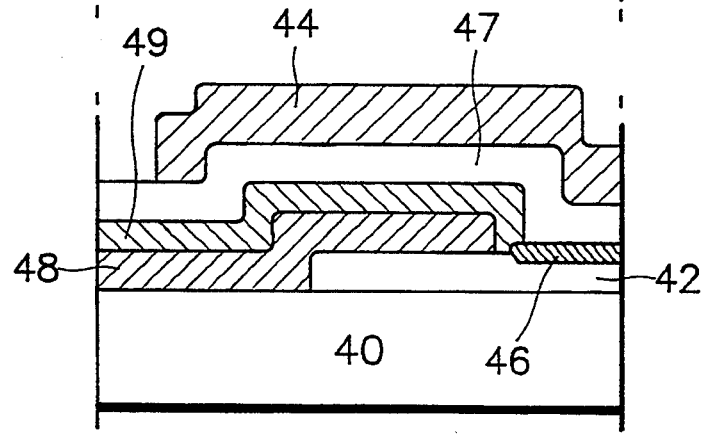
Figure 4E:
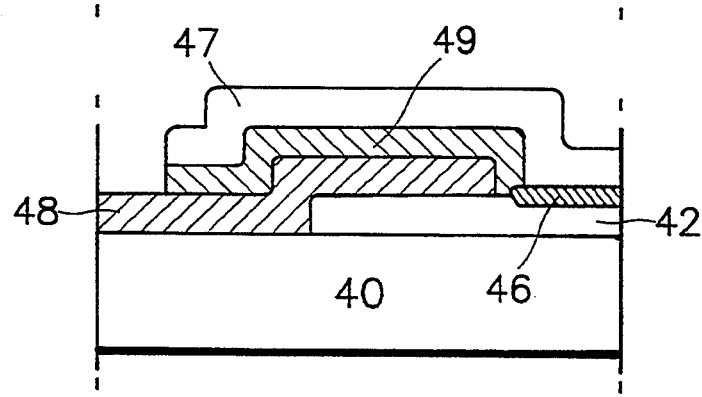

Thereafter, a photoresist layer 44 is applied, as shown in FIG. 4D, on the silicon nitride layer 47 and defined for opening a pad region 48.

Dry etching is carried out with respect to the photoresist mask layer 44 for removing the silicon nitride layer 47 and the anodic oxide layer 49, concurrently. Stripping off the photoresist mask layer 44 completes the formation of the pad 48 to provide the interconnection with the drive circuitry (see FIG. 4E). During the dry etching, the flow rates of $CF_4$ and $O_2$ gases are maintained within the range of 40–50 sccm and 15–20 sccm, respectively. Other gases, e.g., $BCl_3$, $SiCl_4$ or $CCl_4$, could also be used.

As a result, a novel pad formation method is provided for the manufacture of a liquid crystal display panel, wherein the anodic oxidation of the gate lines and electrodes is performed without using a photoresist mask for the selective anodic oxidation thereof, thereby enabling the application of a higher anodization voltage to obtain a thicker Al anodic oxide layer which is conducive to the reduction of shorts between the gate and the data lines.

In accordance with the present invention, the overall processing steps are reduced or simplified, in comparison with the existing techniques, to thereby improve the production efficiency and throughput.

It should be appreciated that dry etching for removing the pad oxide 49 can be performed during any of the processing steps other than the step for opening the pad through the silicon nitride layer 47: for instance, the layer 47 may be patterned prior to the step for removing the pad oxide 49.

Further, insulators other than silicon nitride can be used to provide isolation of the gate electrodes and lines. Also, it is possible that the removal of the pad oxide 49 can also be achieved by employing a wet etching process. In addition, it may be possible to use other metals than, or in addition to, Al or Ta as mentioned in the specification.

The invention may also be applicable to display panels other than a LCD display panel.

While the present invention has been described with respect to certain preferred embodiments only, other modifications and variations may be made without departing from the scope of the present invention as set forth in the following claims.

What is claimed is:

1. A method for manufacturing a display panel comprising the steps of:
   (a) forming a plurality of gate electrodes and a multiplicity of gate lines on a glass substrate;
   (b) creating a multiplicity of pads on the glass substrate, each of said pads extending to cover an edge of each of said respective gate lines so as to provide an electrical coupling therebetween;
   (c) performing an anodic oxidation on said gate electrodes, gate lines and pads to thereby form an anodic oxide layer on the entire surface thereof;
   (d) depositing an insulation layer on said anodic oxide layer and a portion of the glass substrate which is not covered with the anodic oxide layer;
   (e) producing thin film transistors on the insulation layer;
   (f) constructing a photoresist pattern on said thin film transistors and a portion of said insulation layer which is not covered by the thin film transistors;
   (g) etching respective portions of the insulation layer and the anodic oxide layer on said pads by using the photoresist pattern as a mask so as to expose said pads; and
   (h) stripping off the photoresist pattern.

2. A method for manufacturing a display panel comprising the steps of:
   (a) forming a multiplicity of pads on a glass substrate;
   (b) creating of plurality of gate electrodes and a multiplicity of gate lines on the glass substrate, each of said gate lines extending to cover an edge of each of said respective pads so as to provide an electrical coupling therebetween;
   (c) performing an anodic oxidation on said gate electrodes, gate lines and pads to thereby form an anodic oxide layer on the entire surface thereof;
   (d) depositing an insulation layer on said anodic layer and a portion of the glass substrate which is not covered with the anodic oxide layer;
   (e) producing thin firm transistors on the insulation layer;
   (f) constructing a photoresist pattern on said thin film transistors and a portion of said insulation layer which is not covered by the thin film transistors;
   (g) etching respective portions of the insulation layer and the anodic oxide layer on said pads by using the photoresist pattern as a mask so as to expose said pads; and
   (h) stripping off the photoresist pattern.

3. The method according to claim 1 or 2 wherein said insulation layer is made of silicon nitride.

4. The method according to claim 1 or 2, wherein said gate electrodes and lines are made of a metal selected from the group consisting of Al, Ta, Ti and Mo or made of an alloy selected from the group consisting of Mo—Ta and Al alloys.

5. The method according to claim 4, wherein said alloy is selected from group consisting of Al—Si, Al—Pd, Al—Ni, Al—Ge and Al—W.

6. The method according to claim 1 or 2, wherein said pads are made of a metallic material selected from the group consisting of Ta, Ti, Mo and Mo—Ta.

* * * * *